United States Patent [19]

Maloberti et al.

[11] Patent Number: 4,761,615
[45] Date of Patent: Aug. 2, 1988

[54] VOLTAGE REPEATER CIRCUIT WITH LOW HARMONIC DISTORTION FOR LOADS WITH A RESISTIVE COMPONENT

[75] Inventors: Franco Maloberti, D'Isola; Guido Torelli, Alessio, both of Italy

[73] Assignee: SGS Microelettronica SPA, Milan, Italy

[21] Appl. No.: 70,825

[22] Filed: Jul. 6, 1987

[30] Foreign Application Priority Data

Jul. 3, 1986 [IT] Italy .............................. 21018 A/86

[51] Int. Cl.$^4$ ............................................. H03F 3/16
[52] U.S. Cl. .................................... 330/277; 307/475
[58] Field of Search ...................... 330/269, 277, 299; 307/475

[56] References Cited

PUBLICATIONS

"Large Swing CMOS Power Amplifier", Kevin E. Brehmer, IEEE Journal of Solid-State Circuits, vol. SC-18, No. 6, Dec. 1983, pp. 624-629.
"MOS Operational Amplifier Design-A Tutorial Overview", Paul R. Gray, IEEE Journal of Solid-State Circuits, vol. SC-17, No. 6, Dec. 1982, pp. 969-982.
Danilovic et al., "Voltage Stabilization of the Source-Follower Operating Point", *Electronic Engineering*, Feb. 1969, pp. 221-223.

*Primary Examiner*—James B. Mullins
*Attorney, Agent, or Firm*—Wenderoth, Lind & Ponack

[57] ABSTRACT

A voltage repeater circuit with low harmonic distortion for loads with a resistive component has first and second N channel MOSFET transistors and a third P channel MOSFET transistor. The first transistor, whose gate electrode forms an input terminal of the circuit, has its drain electrode connected to the positive terminal of a voltage source via a constant biasing current generator and is coupled, in addition, to the gate electrode of the second transistor by a constant voltage generator and has its source electrode connected to the drain electrode of the second transistor in a circuit node which forms an output terminal of the circuit. The source electrode of the second transistor is connected to the negative terminal of the voltage source. The input terminal of the circuit is also coupled by means of a biasing and amplifying circuit with signal inversion to the gate electrode of the third transistor which has its source electrode connected to the positive terminal of the voltage source and has its drain electrode connected to the output terminal of the circuit.

12 Claims, 5 Drawing Sheets

VOLTAGE REPEATER CIRCUIT WITH LOW HARMONIC DISTORTION FOR LOADS WITH A RESISTIVE COMPONENT

BACKGROUND OF THE INVENTION

The present invention relates to voltage repeater circuits, and in particular to a voltage repeater circuit with low harmonic distortion for loads with a resistive component of a value which is not very high, particularly suitable for incorporation in a monolithically integrated circuit constructed using MOS (Metal Oxide Semiconductor) technology.

It is often necessary in a circuit to apply a voltage supplied by a high output impedance signal voltage generator to a load with a resistive component whose value is not very high (for example a few k$\Omega$). In some applications, moreover, in order to drive the resistive component of the load correctly, it is necessary to be able to supply the latter with a current which may have a high swing when a signal voltage is applied to the load itself.

In order to satisfy this requirement, a voltage repeater circuit is generally interposed between the signal voltage generator and the load. The repeater circuit repeats the input signal voltage as its output and has a high input impedance and a low output impedance, thereby achieving the required impedance decoupling between the voltage generator and the load.

Voltage repeater circuits are used, for example, in complex circuit structures in monolithically integrated circuits.

The essential requirements of a voltage repeater circuit of this type are:
substantially unity voltage gain;
a low output impedance;
the ability to supply all of the continuous and signal currents required to drive the resistive component of the load correctly;
maximum reduction of the harmonic distortion introduced into the output signal, even in the presence of output signals with a high current swing.

Other very important requirements, particularly for some applications, are as follows:
low integration area occupation;
ease of insertion within more complex circuit structures;
limited power dissipation with a high speed of response.

A known voltage repeater circuit, generally known as a unity gain non-inverting "buffer" comprises an open loop high voltage gain operational amplifier A which has its output terminal and its inverting input terminal connected together. The non-inverting input terminal and the output terminal of the operational amplifier respectively form the input terminal and the output terminal of the voltage repeater circuit. The voltage gain of this circuit, as is known to those skilled in the art, is equal to $A/(1+A)$. As a result thereof, if the value of A is sufficiently high (i.e. if $A>>1$), the voltage gain is substantially equal to 1.

The output impedance of the voltage repeater circuit is equal to the output impedance of the open loop operational amplifier divided by the factor $(1+A)$. Using an operational amplifier with a high open loop voltage gain and an open loop output impedance which is not excessively high, for example, a normal amplifier of the type with two voltage gain stages in cascade, the output impedance of the voltage repeater circuit is thus extremely low.

If use is made of an operational amplifier able to drive the resistive component of the load correctly, and in particular able to supply the current required by the latter as an output, the resultant circuit also satisfies the third and the fourth requirements listed above. For this purpose, use is generally made of an operational "power" amplifier, where the term power is added to show that the operational amplifier is able to adequately drive loads with a resistive component which does not have a high value. This type of amplifier in general contains a suitably designed output stage (see, for example, "MOS Operational Amplifier Design - A Tutorial Overview" by P. R. Gray and R. G. Meyer, in IEEE Journal of Solid-State Circuits, Vol. SC-17, No. 6, December 1982, pp. 969–982, Para. VII, and "Large Swing CMOS Power Amplifier" by K. E. Brehmer and J. B. Wieser in IEEE Journal of Solid-State Circuits, Vol. SC-18, No. 6, December 1983, pp. 624–629). An amplifier whose output stage is not designed in a suitable way is not able to supply a continuous output current of appreciable value without its open loop voltage gain being reduced to a comparatively low value.

If use is made of an operational amplifier which comprises two voltage gain stages in cascade and, in general, an additional power output stage, it is possible thus to obtain a voltage repeater circuit which adequately satisfies the first four requirements set out above. The fact that the amplifier comprises two gain stages, however, entails a considerable integration area occupation by the voltage repeater circuit, since it is also necessary to insert within the amplifier a compensation capacitor, which may be of relatively high value, to improve the overall stability of the system. The additional power output stage also increases the integration area occupation.

The power dissipation of this circuit structure may then be excessive, given that there are various circuit "branches" which absorb supply current in a two-stage operational amplifier. It should be borne in mind, in this respect, that the presence of the compensation capacitor must also be taken into account in dimensioning the biasing currents of the amplifier stages in order to obtain an adequate speed of response. The power output stage also requires a further absorption of supply current.

This circuit is, finally, difficult to insert within more complex monolithically integrated circuit structures.

A further known voltage repeater circuit is the so-called source follower.

This circuit substantially comprises as its active component a suitably biased MOSFET transistor which operates in the saturation range. The gate electrode and the source electrode of the transistor respectively form the input terminal and the output terminal of the repeater circuit. A load $R_L$, assumed for the sake of simplicity to be purely resistive, may be inserted between the output terminal and a reference terminal (for example the ground terminal, if the transistor is an N channel MOSFET).

As is known to persons skilled in the art, if the transconductance $g_m$ of the transistor is much greater than the reciprocal of its output resistance, for the point of view of the signal, this circuit, for signal frequencies lower than its cut-off frequency, is substantially equivalent to a voltage generator having a voltage value equal to the signal voltage applied to the input and having in series a resistance which is roughly equal to the reciprocal of the transconductance $g_m$ of the transistor. The voltage gain of the circuit is therefore approximately equal to $R_L/(R_L+1/g_m)$. If the transconductance $g_m$ of the transistor is much greater than the reciprocal of the load resistance $R_L$, the source follower circuit substantially has unity voltage gain.

The voltage repeater circuit obtained in this way has, however, the following drawbacks:

in some types of applications, in particular if the load resistance $R_L$ is a few k$\Omega$, the ouptut impedance of the circuit (equal, as mentioned above, to $1/g_m$) may not be low enough to ensure a voltage gain value for the repeater circuit which is sufficiently close to unity;

if there is a high swing in the input signal voltage (and therefore in the output signal voltage), the value of the total current absorbed by the load varies considerably with variations in the value of the signal voltage. If the load resistance $R_L$ has a low value, there is an appreciable variation in the current which passes through the transistor, and thus in the value of the transconductance of the latter, with variations in the value of the voltage supplied as output (it is known, in fact, that the transconductance of the MOS-type field effect transistor operating in the saturation range is proportional to the square root of the current passing through the transistor). The voltage gain of this circuit therefore varies with variations in the voltage supplied as output, which leads to the introduction of harmonic distortion into the output signal.

In order to obtain a lower value than that which may be obtained with the conventional source follower circuit described above for the output impedance of the voltage repeater circuit, and therefore to obtain a circuit with a voltage gain which is even closer to unity, use may be made of a more complex known circuit structure, shown in FIG. 1.

The circuit comprises a first N channel MOSFET transistor M1 and a second P channel MOSFET transistor M2. The gate electrode of the transistor M1 forms an input terminal IN of the voltage repeater circuit.

The drain electrode of the transistor M1 and the gate electrode of the transistor M2 are connected together in a first circuit node D1 which is connected to the positive terminal $V_{DD}$ of a voltage supply via a first constant current generator $I_{B1}$.

The source electrode of the transistor M1 and the drain electrode of the transistor M2 are connected together in a second circuit node which is connected to the negative terminal $V_{SS}$ of the voltage supply via a second constant current generator $I_{B2}$. This circuit node forms an output terminal OUT of the voltage repeater circuit.

The source electrode of the transistor M2 is connected to the positive terminal $V_{DD}$.

The substrate electrode of the transistor M1 is directly connected to its source electrode.

A load $R_L$, of a purely resistive type for the purposes of illustration, is inserted between the output terminal OUT and the negative terminal $V_{SS}$.

The two constant biasing current generators $I_{B1}$ and $I_{B2}$ are constructed using techniques known to those skilled in the art: the values of the currents which they supply are correlated and are such as to suitably bias the two transistors M1 and M2 which operate in the saturation range.

FIG. 1 also shows a capacitor $C_C$ connected between the circuit node D1 and the negative terminal $V_{SS}$ which may possibly be necessary for frequency compensation. This capacitor has a fairly small value of a very few pF. In the description of the operation of the circuit which follows and which relates to signal frequencies lower than the cut-off frequency of the circuit, the effects of this capacitor will be disregarded.

When a voltage to be repeated $V_{in}$ is supplied between the input terminal IN and the negative terminal $V_{SS}$, an output voltage $V_{out}$ is supplied by the repeater circuit between the output terminal OUT and the negative terminal $V_{SS}$.

The two transistors M1 and M2 and the load resistance $R_L$ are traversed by currents which are indicated in FIG. 1 by $I_1$, $I_2$ and $I_{out}$ respectively.

FIG. 2a shows the equivalent circuit for a small signal of the circuit of FIG. 1. This circuit is obtained by substituting its equivalent circuit for each of the components of the circuit structure of FIG. 1. Each of the two MOSFET transistors is replaced by a circuit formed by the parallel connection of the output resistance of the transistor and a voltage controlled current generator which supplies, in the drain-source direction with an input direction into the source electrode, a current whose value is equal to the product of the transconductance of the transistor and the signal voltage present between the gate electrode and the source electrode of the transistor itself. Each of the two constant biasing current generators, considered to be real, is replaced by its own equivalent output resistance. In FIG. 2a account has in contrast been taken of the fact that, from the point of view of the signal, the two terminals of the voltage supply are considered to be a short circuit. In accordance with the above, in this equivalent circuit the compensation capacitor $C_C$ has been disregarded. The load resistance $R_L$ is inserted between the output terminal OUT and the negative terminal $V_{SS}$.

In FIG. 2a, $v_{gs1}$, $g_{m1}$ and $r_{ds1}$ respectively indicate the signal voltage between the gate electrode and the source electrode, the transconductance and the output resistance of the transistor M1; $v_{gs2}$, $g_{m2}$ and $r_{ds2}$ respectively indicate the signal voltage between the gate electrode and the source electrode, the transconductance and the output resistance of the transistor M2 and $r_{k1}$ and $r_{k2}$ respectively indicate the output resistance of the constant biasing current generator $I_{B1}$ and that of the generator $I_{B2}$; $v_{in}$ and $v_{out}$ respectively indicate the input signal voltage and the output signal voltage; $i_{out}$ indicates the output signal current which passes through the load resistance $R_L$: this obviously produces $i_{out} = -v_{out}/R_L$.

Applying Thevenin's theorem, the equivalent circuit of FIG. 2a is converted into the circuit shown in FIG. 2b, in which the equivalent circuit of the voltage repeater circuit is replaced by a real signal voltage generator $v_s$ having an output resistance $r_{out}$.

If $g_{m1} \gg 1/r_{ds1}$, simple calculations provide $v_s \simeq v_{in}$.

The calculation of the output resistance of the circuit $r_{out}$ may be carried out, with reference to FIG. 2a, by supplying a voltage $v_x$ between the output terminal OUT and the negative terminal $V_{SS}$ and calculating the current $i_x$ which enters the voltage repeater circuit via the output terminal, assuming that the input terminal IN is connected to a fixed potential ($v_{in}=0$). This produces, by definition:

$$r_{out} = v_I/i_I \qquad (1)$$

Obviously, $v_{gs1} = -v_x$, given that the gate electrode of the transistor M1 is assumed to be connected to a fixed potential.

It is now necessary to calculate the signal voltage $v_{gs2}$. If the signal current passing through the resistance $r_{k1}$ is called $i_{k1}$, this produces:

$$i_{k1} = \frac{v_{gs2} - v_z}{r_{ds1}} + g_{m1}v_{gs1} = \frac{v_{gs2} - v_z}{r_{ds1}} - g_{m1}v_z \quad (2)$$

$$v_{gs2} = -i_{k1}r_{k1} = -\frac{r_{k1}}{r_{ds1}}(v_{gs2} - v_z) + g_{m1}v_z r_{k1} \quad (3)$$

$$v_{gs2}\left(1 + \frac{r_{k1}}{r_{ds1}}\right) = v_z\frac{r_{k1}}{r_{ds1}} + g_{m1}v_z r_{k1} \quad (4)$$

$$\frac{v_{gs2}}{r^*_d} = v_z\left(\frac{1}{r_{ds1}} + g_{m1}\right) \quad (5)$$

in which $r^*_d \equiv r_{ds1}r_{k1}/(r_{ds1}+r_{k1})$ is the resistance equivalent to the parallel connection of $r_{ds1}$ and $r_{k1}$.

If $g_{m1} >> 1/r_{ds1}$, this produces:

$$V_{gs2} \approx V_z G_{m1} r^*_d \quad (6)$$

Thus, disregarding the currents passing through $r_{ds1}$ and $r_{ds2}$ with respect to the currents $g_{m1}v_{gs1}$ and $g_{m2}v_{gs2}$, and also disregarding the current passing through the resistance $r_{k2}$, the following is produced:

$$i_I \approx -g_{m1}v_{gs1} + g_{m2}v_{gs2} \approx g_{m1}v_I + g_{m2}g_{m1}r^*_d \cdot v_I = g_{m1}(1 + g_{m2}r^*_d)v_I \quad (7)$$

which finally provides:

$$r_{out} \approx \frac{1}{g_{m1}(1 + g_{m2}r^*_d)} \quad (8)$$

With respect to the simple source follower circuit described above, the circuit of FIG. 1 therefore has an output resistance which is lower by a factor $(1+g_{m2}r^*_d)$, which, with a normal dimensioning of the circuit $(g_{m2} >> 1/r^*_d)$ is approximately equal to $g_{m2}r^*_d$. The voltage gain of the circuit, which is substantially equal to $R_L/(R_L+r_{out})$ is consequently fairly close to unity even in the presence of load resistances of relatively low value.

The value of the harmonic distortion introduced into the output signal, however, although reduced with respect to the case of the simple source follower circuit, is still not at an optimum value. The value of the current $I_1$ which passes through the transistor M1 is equal to the current supplied by the constant current generator $I_{B1}$, as a result of which the value of the transconductance $g_{m1}$ remains constant and does not depend on the voltage value $V_{out}$ supplied as output. The value of $r^*_d$ does not depend either on the value of the voltage supplied as output, given that neither $r_{k1}$ nor $r_{ds1}$ depend thereon. In the presence of wide voltage swings in the output signal, however, the value of the current $I_{out}$ which passes through the load resistance $R_L$ varies greatly as a function of the voltage itself. Given that the entire signal current $i_{out}$ which passes through the output resistance passes through the transistor M2 (which in fact gives $I_2=I_{out}+I_{B2}-I_1$), if the value of the load resistance $R_L$ is not very high, the value of the current $I_2$ which passes through the transistor M2 varies substantially with variations in the voltage $V_{out}$ and as a result of which the value of the transconductance $g_{m2}$ and therefore the value of $r_{out}$ vary as a function of the latter. The voltage gain of the circuit structure of FIG. 1 therefore varies with variations in the value of the voltage supplied as output and harmonic distortion is consequently introduced into the output signal.

In order to reduce the harmonic distortion in the output signal, it would be possible to bias the circuit in such a way that the rest value of the current $I_2$ is much higher than the maximum output signal current $i_{out}$ in order to make the variations to which the transconductance $g_{m2}$ is subject when the voltage supplied as output by the circuit varies, negligible. This would lead, however, in the presence of loads with a resistive component of relatively low value, to an excessive power dissipation by the circuit and would not, therefore, be an ideal solution.

SUMMARY OF THE INVENTION

The object of the present invention is to construct a voltage repeater circuit designed to drive a load with a resistive component with a fairly low value, which introduces into the output signal only a low harmonic distortion and which, at the same cost, has operating features which represent overall improvement over known circuits.

This object is achieved, in accordance with the present invention, by providing a voltage repeater circuit with low harmonic distortion for loads with a resistive component, having at least one input terminal for connection to a voltage generator and at least one output terminal for connection to a load, comprising first and second MOSFET transistors having a first type of conductivity, and a third MOSFET transistor having a second type of conductivity opposite to said first type of conductivity, a gate electrode of said first transistor forming the input terminal of the repeater circuit; a source electrode of said first transistor and drain electrodes of said second and third transistors being connected together in a first circuit node which forms the output terminal of the repeater circuit; a drain electrode of said first transistor being connected to a first terminal of a voltage supply by means of a constant current generator and being further coupled to a gate electrode of said second transistor by a first constant voltage generator; a source electrode of said second transistor being connected to a second terminal of said voltage supply; a source electrode of said third transistor being connected to said first terminal of said voltage supply, the input terminal of the voltage repeater circuit being further coupled to a gate electrode of said third transistor by a circuit means for biasing and amplificatio with signal inversion.

BRIEF DESCRIPTION OF THE DRAWINGS

The invention is set out in detail in the following description, given purely by way of non-limiting example, with reference to the following drawings, in which:

FIG. 2b is a diagram of a simplified equivalent circuit derived from the circuit of FIG. 2a;

FIG. 5b is a diagram of a simplified equivalent circuit derived from the circuit of FIG. 5a;

DESCRIPTION OF THE PREFERRED EMBODIMENTS

Figure 3:
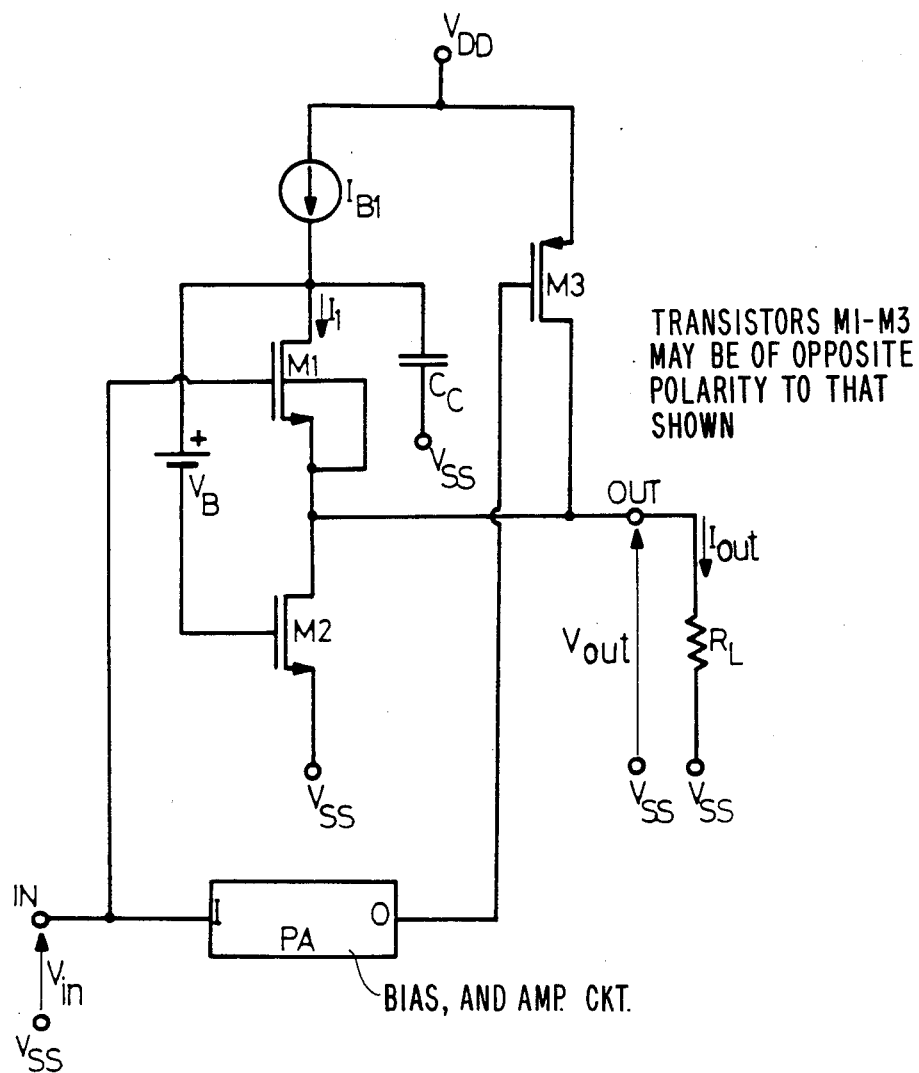
FIG. 3 is a circuit diagram, partly in block form, of a voltage repeater circuit with low harmonic distortion, for loads with a resistive component whose value is not very high, in accordance with the present invention.

A voltage repeater circuit of the invention shown in FIG. 3 comprises a first, M1, and a second transistor M2, both N channel MOSFET transistors and a third P channel MOSFET transistor M3.

The gate electrode of the transistor M1 forms an input terminal IN of the voltage repeater circuit.

The source electrode of the transistor M1 and the drain electrodes of the transistors M2 and M3 are connected together in a circuit node which forms an output terminal OUT of the voltage repeater circuit.

The drain electrode of the transistor M1 is connected to the positive terminal $V_{DD}$ of a voltage supply via a constant current generator $I_{B1}$, constructed in a manner known to persons skilled in the art, and is also connected to the gate electrode of the transistor M2 via a constant voltage generator $V_B$ designed to allow a correct biasing of the transistor M2. This voltage generator may be formed, for example, by a so-called "level shifter" constructed in a manner known to those skilled in the art.

The substrate electrode of the transistor M1 is directly connected to its source electrode.

The source electrodes of the transistors M2 and M3 are respectively connected to the negative terminal $V_{SS}$ and the positive terminal $V_{DD}$ of the voltage supply.

The input terminal IN is also coupled to the gate electrode of the transistor M3 by a biasing and amplifying circuit, with signal inversion, shown in FIG. 3 by the symbol PA. This circuit block, which has an input terminal I and an output terminal O, repeats, between the output terminal and the negative terminal $V_{SS}$, a signal voltage supplied between the input terminal and the negative terminal $V_{SS}$, inverting and amplifying it by a factor $A_B$ (which is generally approximately unity, but may be less than 1). The circuit PA which may be constructed in a manner known to those skilled in the art, also supplies, between its output terminal O and the positive terminal $V_{DD}$, a suitable continuous potential difference so as to enable a correct biasing of the transistor M3.

Figure 4:
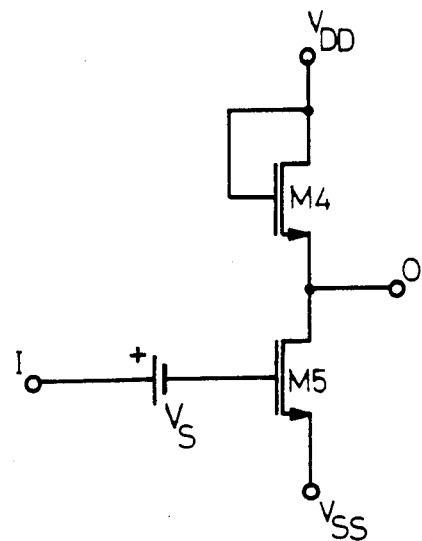
FIG. 4 is a partial circuit diagram of a block section of the circuit of FIG. 3.

A circuit diagram of a preferred embodiment of the circuit PA is shown in FIG. 4. It comprises two N channel MOSFET transistors M4 and M5 which operate in the saturation range. The drain and gate electrodes of the transistor M4 are connected to the positive terminal $V_{DD}$ of the voltage supply which supplies the voltage repeater circuit, and the source electrode of the transistor M5 is connected to the negative terminal $V_{SS}$ of the voltage supply. The input terminal I of the circuit PA is connected to the gate electrode of the transistor M5 via a constant voltage generator $V_S$. The source electrode of the transistor M4 and the drain electrode of the transistor M5 are connected together in a circuit node which forms the output terminal O of the circuit itself. The series connection of the two transistors M4 and M5 substantially forms an inverter, and the constant voltage generator $V_S$ enables a correct biasing of the transistor M5. By means of the dimensioning of the circuit, carried out using known techniques, both the voltage gain $A_B$ of the inverter and the value of the direct voltage supplied by the circuit itself between the output terminal O and the positive terminal $V_{DD}$ are suitably fixed.

The circuit of FIG. 3 also comprises a capacitor $C_C$ connected between the drain electrode of the transistor M1 and the negative terminal $V_{SS}$ which may be needed for frequency compensation. This capacitor has a relatively small value of a very few pF. As in the case of the circuit of FIG. 1, in the following description of the operation of the circuit with reference to signal frequencies lower than the cut-off frequency of the circuit, the effects of this capacitor will be disregarded.

All three transistors M1, M2 and M3 of the circuit operate in the saturation range.

A load $R_L$, purely of a resistive type for the purposes of illustration, is inserted between the output terminal OUT of the voltage repeater circuit and the negative terminal $V_{SS}$.

When a voltage to be repeated $V_{in}$ is supplied between the input terminal IN and the negative terminal $V_{SS}$, an output voltage $V_{out}$ is then supplied by the repeater circuit between the output terminal OUT and the negative terminal $V_{SS}$.

Figure 5A:
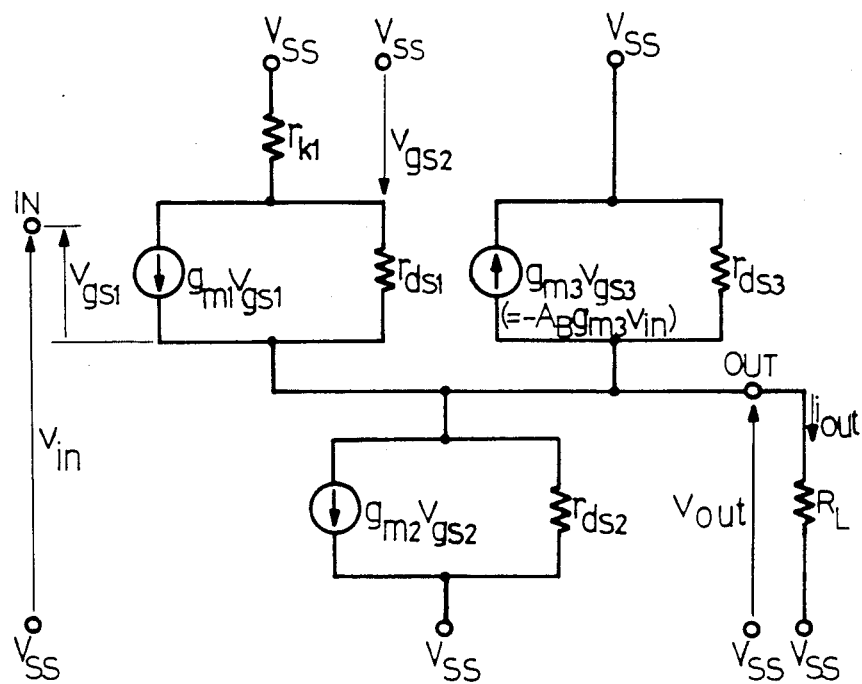
FIG. 5a is a diagram of an equivalent circuit for a small signal of the voltage repeater circuit of the invention shown in FIG. 3.

FIG. 5a shows an equivalent circuit for a small signal of FIG. 3. As in the case of the equivalent circuit of FIG. 2a, this circuit is obtained by substituting its equivalent circuit for each of the components of the circuit structure of FIG. 3. The compensation capacitor $C_C$ has been disregarded. In obtaining the equivalent circuit, account has been taken of the fact that, from the point of view of the signal, the two terminals of the voltage supply are considered to be a short-circuit, and also that the constant voltage generator $V_B$ is seen as a short-circuit. The load resistance $R_L$, through which there passes a signal current shown in FIG. 5a by $i_{out}$, is obviously inserted between the output terminal OUT and the negative terminal $V_{SS}$.

In FIG. 5a, $v_{gsi}$, $g_{mi}$ and $r_{dsi}$ respectively indicate the signal voltage present between the gate electrode and the source electrode, the transconductance and the output resistance of the transistor Mi, for i=1, 2, 3, and $r_{k1}$ indicates the output resistance of the constant biasing current generator $I_{B1}$ considered to be real; $v_{in}$ and $v_{out}$ respectively indicate the input signal voltage and the output signal voltage.

It is evident from the above description of the circuit PA that $v_{gs3} = -A_B v_{in}$.

Figure 2A:
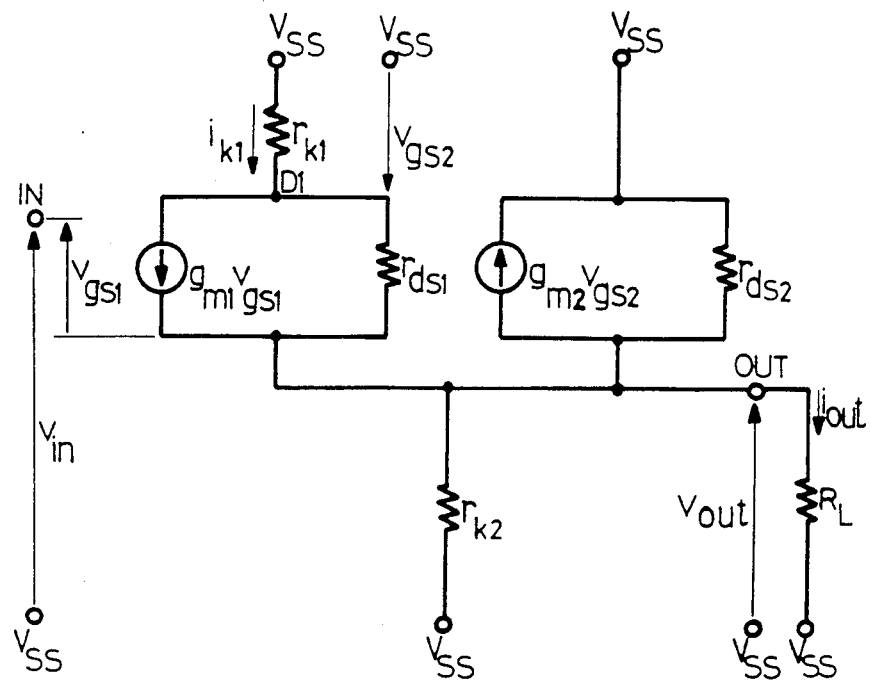
FIG. 2a is a diagram of an equivalent circuit for a small signal of the known voltage repeater circuit shown in FIG. 1.
Figure 2B:
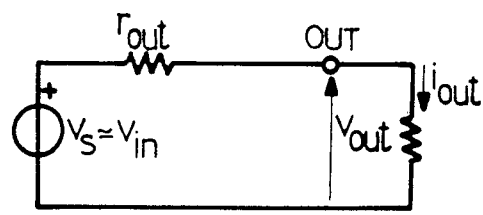

A rapid analysis of the equivalent circuit of FIG. 5a shows that, except for the presence of the equivalent circuit of the transistor M3, it is substantially identical to the equivalent circuit of FIG. 2a. Applying Thevenin's theorem, therefore, the equivalent circuit of the repeater circuit of FIG. 3 may also be converted into a simpler equivalent circuit, shown in FIG. 5b, which, using the same hypotheses from which the circuit of FIG. 2b was obtained, is substantially formed by a real voltage generator having a value $v_{in}$, with an output resistance $r_{out}$ whose value is provided by expression (8), with which there is disposed in parallel the equivalent circuit of the transistor M3, formed by the connection in parallel of a controlled current generator of value $g_{m3}v_{gs3} = -A_B g_{m3}v_{in}$ with a resistance of value $r_{ds3}$. In the equivalent circuit of FIG. 5b, the resistance $r_{ds3}$, which, with a normal dimensioning of the circuit, would be much greater than $r_{out}$, has been disregarded, and the sign of the current from the controlled current generator, whose value is therefore equal to $+A_B g_{m3} v_{in}$, has been changed.

Figure 1:
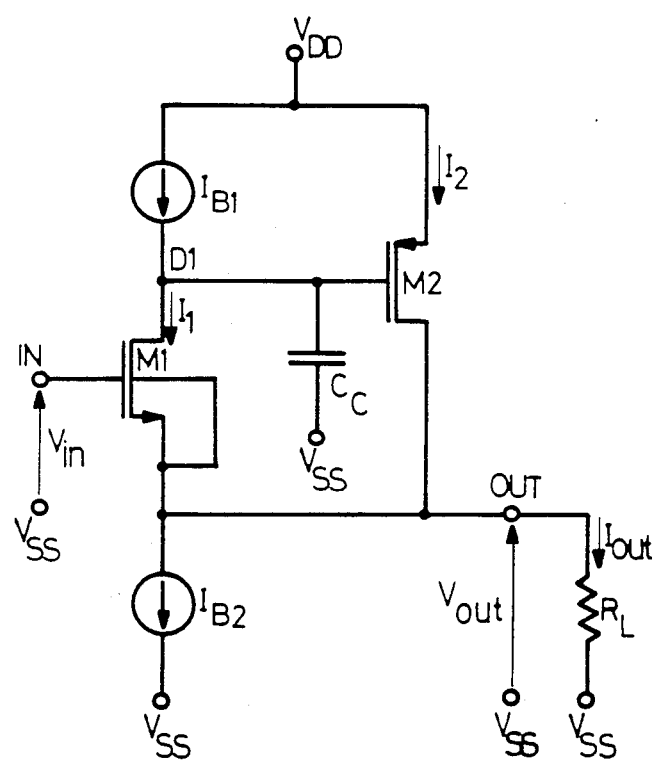
FIG. 1 is a circuit diagram of the known voltage repeater circuit comprising two MOSFET transistors described above.

The fact that the output resistance of the repeater circuit of FIG. 3 is identical to that of the circuit of FIG. 1 and that it is not, in practice, affected by the presence of the transistor M3 is a result of the fact that the current supplied by the latter is substantially not subject to variations if a signal voltage $v_x$ is supplied between the output terminal OUT and the negative terminal $V_{SS}$.

Figure 5B:
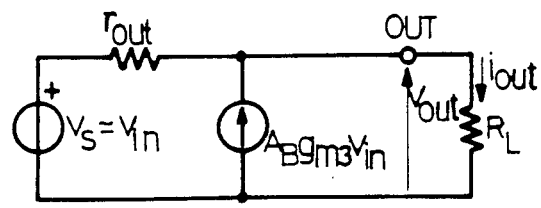

From the equivalent circuit of FIG. 5b it can be seen that, in a similar way to the known circuit of FIG. 1, using the hypothesis $r_{out} < < R_L$, the output signal voltage $v_{out}$ is substantially determined by the voltage generator $v_{in}$ and is not appreciably affected by the current generator $A_B g_{m3} v_{in}$. In other words, the circuit network comprising the transistors M1 and M2, the constant voltage generator $V_B$ and the constant biasing current generator $I_{B1}$, which is, from the point of view of the signal, equivalent to a generator of a real voltage having a value signal to the input signal voltage, means that the output signal voltage $v_{out}$ is substantially identical to the input signal voltage $v_{in}$, even in the presence of load resistances of relatively low value, as a result of which the voltage gain of the repeater circuit of FIG. 3 is fairly close to unity in this case as well.

The function of the transistor M3 is substantially that of a generator of a current of variable value, controlled by a voltage whose value is proportional to the input signal voltage $v_{in}$. By suitably dimensioning the circuit PA and the transistor M3, the signal current supplied by this controlled generator, $A_B g_{m3} v_{in}$, is equal to the signal current passing through the load resistance $i_{out} = v_{out}/R_L$ such that the transistor M2 in practice has no signal current passing through it and therefore keeps the value of its own transconductance $g_{m2}$ substantially unchanged during variations in the voltage $v_{out}$ supplied as output.

As in the case of the circuit structure of FIG. 1, the value of the current passing through the transistor M1, $I_1$, and therefore that of the transconductance $g_{m1}$, as well as the value of the resistance $r^*_d$ equal to the parallel connection of the resistances $r_{ds1}$ and $r_{k1}$, are substantially independent of the value of the voltage $V_{out}$ supplied as output. Given that, as mentioned above, the value of $g_{m2}$ is also substantially independent of the value of $V_{out}$, the value of the output resistance $r_{out}$ of the repeater circuit of FIG. 3, given by expression (8), remains practically constant when the voltage supplied as output varies. The repeater circuit of FIG. 3 does not, therefore, in practice introduce harmonic distortion into the output signal.

If the circuit of FIG. 3 is to function optimally, it is necessary for $A_B g_m \approx 1/R_L$ such that all the signal current $i_{out}$ passing through $R_L$ is supplied by the current generator constructed with the transistor M3 and does not pass through the transistor M2. Naturally, in the event of wide swings of the input voltage $V_{in}$ the value of the total output current $I_{out}$ and therefore that of $g_{m3}$ vary appreciably, as a result of which the above equation is not correctly satisfied for all the values of the input voltage. The variation of the value of the output resistance $r_{out}$ of the circuit during the variation of the voltage supplied as output caused by this is, however, of second order, as a result of which the harmonic distortion introduced into the output signal is greatly reduced with respect to the case of the known circuit structure of FIG. 1.

The circuit of FIG. 3 also satisfies requirements 5, 6 and 7 mentioned in the preamble fairly well, since it requires a smallish integration area for construction, can be readily inserted within complex circuit structures and does not require numerous stages and therefore a high total supply current. The circuit PA included in the structure of FIG. 3 may also be constructed with a stage which absorbs little supply current, as for example with the circuit shown in FIG. 4.

In the case in which the load also has a capacitive component, the analysis given above is still fully valid, although for signal frequencies lower than the cut-off frequency of the resultant circuit.

As in the source follower circuit and in the known circuit of FIG. 1, there is also a difference in the circuit of FIG. 3 between the direct voltage supplied as input and the resultant direct voltage supplied as output. This difference, defined as the "offset" voltage between input and output, is equal to the threshold voltage of the transistor M1 plus the gate-source voltage required for the current $I_1$ to pass through this transistor. This voltage, generally called the "overdrive" voltage $V_{OV}$, is expressed as $V_{OV} = \sqrt{I_1 L/k'W}$, in which L and W are the length (distance between drain and source) and the width of the transistor respectively, and k' is its conduction factor. In some applications the presence of the offset voltage between input and output is a drawback.

Figure 6:
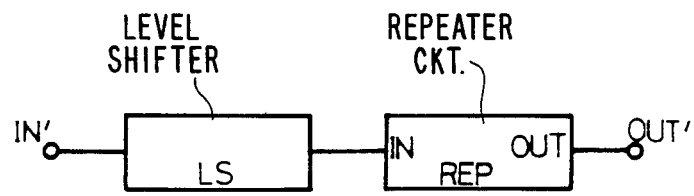
FIG. 6 is a block diagram of a voltage repeater circuit with low harmonic distortion, for loads with a resistive component whose value is not very high, in accordance with a further preferred embodiment of the invention, comprising the circuit of FIG. 3.

FIG. 6 shows the block diagram of a further circuit structure of the invention which may be used in these cases as a voltage repeater circuit which does not have this drawback. This circuit structure, having an input terminal IN' and an output terminal OUT' is developed on a voltage repeater circuit constructed in accordance with the diagram of FIG. 3. This voltage repeater circuit, which has an offset voltage which is not zero between input and output, is shown in FIG. 6 by a block designated by the symbol REP having an input terminal IN and an output terminal OUT.

The output terminal OUT of the circuit REP also forms the output terminal OUT' of the overall circuit structure. The input terminal IN' of the overall circuit structure is in contrast coupled to the input terminal IN of the circuit REP by a level shifter circuit, constructed in a known manner, which is shown in FIG. 6 by a block designated by the symbol LS. This circuit generates, between the input terminal IN' of the structure and the input terminal IN of the circuit REP, a constant potential difference which is equal in absolute terms. but of opposite sign, to the offset voltage between the input and output of the circuit REP.

From the point of view of the signal, the block LS is obviously equivalent to a short-circuit, as a result of which the circuit structure of FIG. 6 behaves in exactly the same way as the circuit of FIG. 3 for the signal. The offset voltage between the input terminal IN' and the output terminal OUT' is equal to the sum of the potential difference between the terminals IN' and IN and the offset voltage between the terminals IN and OUT and is substantially zero. The circuit structure of FIG. 6 therefore behaves, as desired, as a voltage repeater circuit with low harmonic distortion and a zero offset between input and output, designed to drive a load with a resistive component whose value is not high.

Although a single embodiment of the invention has been described and illustrated, it is evident that many variants are possible without departing from the scope of the invention.

For example, in a further circuit of the invention, the substrate electrode of the transistor M1 is not connected to the source electrode of the transistor itself, but to the negative terminal $V_{SS}$ of the supply voltage generator. In this case, when the voltage $V_{out}$ supplied as output varies there is a variation in the voltage between the source and substrate electrodes of the transistor M1. As a result of the so-called "body" effect there is a variation in the current-voltage characteristics of the transistor itself, and therefore the output resistance $r_{out}$ of the voltage repeater circuit depends on the value of the voltage $V_{out}$, although this dependence is an effect of second order as a result of which this circuit embodiment, which is simpler than that of FIG. 3 from a constructional point of view, is also satisfactory for some applications.

A further circuit of the invention may be constructed in a way which is fully complementary with that shown in FIG. 3. The transistors M1 and M2, in this case, must both be P channel transistors and the transistor M3 must be an N channel transistor. The source electrode of the transistor M2 is connected to the positive terminal $V_{DD}$ rather than to the negative terminal $V_{SS}$ of the voltage supply, while the source electrode of the transistor M3 is connected to the negative terminal $V_{SS}$ rather than to the positive terminal $V_{DD}$. The polarity of the constant voltage generator $V_B$ and the sign of the current generated by the constant current $I_{B1}$ must obviously be such as to enable a correct biasing of the transistors of the circuit. The circuit PA may also, in this case, be constructed in a complementary way to that shown in FIG. 4. Both transistors M4 and M5 must then be P channel transistors. The drain and gate electrodes of the transistor M4 are connected to the negative terminal $V_{SS}$ rather than to the positive terminal $V_{DD}$, while the source electrode of the transistor M5 is connected to the positive terminal $V_{DD}$. The voltage generator $V_S$ must obviously have a polarity such as to enable a correct biasing of the transistor M5. The direct voltage supplied by the circuit block between its output terminal O and the negative terminal $V_{SS}$ must be such as to enable a correct biasing of the transistor M3 of the voltage repeater circuit.

As an alternative, the inverter included in the circuit PA may also be constructed with two complementary MOSFET transistors, one N channel and the other P channel.

It is also possible to obtain from the circuit of FIG. 3, with simple circuit modifications within the scope of those skilled in the art, a circuit which uses only MOSFET transistors of the same polarity.

We claim:

1. A voltage repeater circuit with low harmonic distortion for loads with a resistive component, having at least one input terminal for connection to a voltage generator and at least one output terminal for connection to a load, comprising: first and second MOSFET transistors having a first type of conductivity, and a third MOSFET transistor having a second type of conductivity opposite to said first type of conductivity, a gate electrode of said first transistor forming the input terminal of the repeater circuit; a source electrode of said first transistor and drain electrodes of said second and third transistors being connected together in a first circuit node which forms the output terminal of the repeater circuit; a drain electrode of said first transistor being connected to a first terminal of a voltage supply by means of a constant current generator and being further coupled to a gate electrode of said second transistor by a first constant voltage generator; a source electrode of said second transistor being connected to a second terminal of said voltage supply; a source electrode of said third transistor being connected to said first terminal of said voltage supply, the input terminal of the voltage repeater circuit being further coupled to a gate electrode of said third transistor by a circuit means for biasing and amplification with signal inversion.

2. A voltage repeater circuit as claimed in claim 1, wherein a substrate electrode of said first transistor is directly connected to said source electrode of said first transistor.

3. A voltage repeater circuit as claimed in claim 2, further comprising a compensation capacitor connected between said drain electrode of said first transistor and one of said two terminals of the said voltage supply.

4. A voltage repeater circuit as claimed in claim 3, wherein said first and second transistors are N channel MOSFET transistors and said third transistor is a P channel MOSFET transistor.

5. A voltage repeater circuit as claimed in claim 3, wherein said first and second transistors are P channel MOSFET transistors and said third transistor is an N channel MOSFET transistor.

6. A voltage repeater circuit as claimed in claim 2, wherein said first and second transistors are N channel MOSFET transistors and said third transistor is a P channel MOSFET transistor.

7. A voltage repeater circuit as claimed in claim 2, wherein said first and second transistors are P channel MOSFET transistors and said third transistor is an N channel MOSFET transistor.

8. A voltage repeater circuit as claimed in claim 1, further comprising a compensation capacitor connected between said drain electrode of said first transistor and one of said two terminals of the said voltage supply.

9. A voltage repeater circuit as claimed in claim 8, wherein said first and second transistors are N channel MOSFET transistors and said third transistor is a P channel MOSFET transistor.

10. A voltage repeater circuit as claimed in claim 8, wherein said first and second transistors are P channel MOSFET transistors and said third transistor is an N channel MOSFET transistor.

11. A voltage repeater circuit as claimed in claim 1, wherein said first and second transistors are N channel MOSFET transistors and said third transistor is a P channel MOSFET transistor.

12. A voltage repeater circuit as claimed in claim 1, wherein said first and second transistors are P channel MOSFET transistors and said third transistor is an N channel MOSFET transistor.

* * * * *